(12) United States Patent
Jang et al.

(10) Patent No.: US 11,809,657 B2
(45) Date of Patent: *Nov. 7, 2023

(54) DISPLAY DEVICE

(71) Applicant: LG Display Co., Ltd., Seoul (KR)

(72) Inventors: Jae-Hyung Jang, Paju-si (KR); Min-Joo Kim, Seoul (KR); Eun-Pyo Hong, Paju-si (KR); Jae-Won Lee, Goyang-si (KR); Sang-Hoon Pak, Seoul (KR); Sang-Hyuk Won, Gimpo-si (KR); Yeon-Woo Shin, Seoul (KR); Ji-Hun Lee, Anseong-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/836,949

(22) Filed: Jun. 9, 2022

(65) Prior Publication Data
US 2022/0300138 A1 Sep. 22, 2022

Related U.S. Application Data

(63) Continuation of application No. 17/345,974, filed on Jun. 11, 2021, now Pat. No. 11,392,243, which is a
(Continued)

(30) Foreign Application Priority Data

Nov. 9, 2018 (KR) ........................ 10-2018-0137407

(51) Int. Cl.
*G06F 3/041* (2006.01)
*G06F 3/044* (2006.01)
(Continued)

(52) U.S. Cl.
CPC ........ *G06F 3/04164* (2019.05); *G06F 3/0412* (2013.01); *G06F 3/0446* (2019.05);
(Continued)

(58) Field of Classification Search
CPC .. G06F 3/04164; G06F 3/0446; G06F 3/0412; H01L 27/322; H01L 27/323
See application file for complete search history.

(56) References Cited

U.S. PATENT DOCUMENTS 10,276,646 B2 4/2019 Kim et al.
10,636,864 B2 4/2020 Kim et al.
(Continued)

FOREIGN PATENT DOCUMENTS

CN 106775173 A 5/2017
CN 107491209 A 12/2017
(Continued)

OTHER PUBLICATIONS

European Patent Office, Office Action, EP Patent Application No. 19208057.0, dated Jan. 3, 2022, 14 pages.
(Continued)

*Primary Examiner* — Abbas I Abdulselam
(74) *Attorney, Agent, or Firm* — Fenwick & West LLP

(57) ABSTRACT

The present disclosure relates to a display device for improving productivity. The display device having a touch sensor is configured such that the total thickness of at least one inorganic insulation layer disposed on the region above each of dams is different from the total thickness of the at least one inorganic insulation layer disposed on a trench region between the dams. Thus, a photoresist for forming a routing line is formed so as to have a uniform thickness on the region above each of the dams and the trench region between the dams, and thus productivity is improved.

18 Claims, 16 Drawing Sheets

Related U.S. Application Data continuation of application No. 16/664,603, filed on Oct. 25, 2019, now Pat. No. 11,061,505.

(51) Int. Cl.
  *H10K 50/824* (2023.01)
  *H10K 50/844* (2023.01)
  *H10K 50/842* (2023.01)
  *H10K 59/12* (2023.01)
  *H10K 59/38* (2023.01)
  *H10K 59/40* (2023.01)

(52) U.S. Cl.
  CPC ......... *H10K 50/824* (2023.02); *H10K 50/844* (2023.02); *H10K 50/8426* (2023.02); *H10K 59/12* (2023.02); *H10K 59/38* (2023.02); *H10K 59/40* (2023.02); *G06F 2203/04111* (2013.01)

(56) References Cited

U.S. PATENT DOCUMENTS

| | | | |
|---|---|---|---|
| 10,642,390 B2 | 5/2020 | Lee et al. | |
| 10,732,460 B1* | 8/2020 | Chen | G02F 1/133621 |
| 11,049,927 B2 | 6/2021 | Kim et al. | |
| 11,061,505 B2 | 7/2021 | Jang et al. | |
| 11,063,238 B2 | 7/2021 | Lee et al. | |
| 11,307,691 B2 | 4/2022 | Lee et al. | |
| 11,392,243 B2* | 7/2022 | Jang | H01L 51/5246 |
| 11,569,338 B2 | 1/2023 | Kim et al. | |
| 11,744,102 B2 | 8/2023 | Lee et al. | |
| 2011/0285641 A1 | 11/2011 | Huang | |
| 2016/0190503 A1 | 6/2016 | Chang et al. | |
| 2018/0032189 A1 | 2/2018 | Lee et al. | |
| 2018/0061899 A1 | 3/2018 | Oh et al. | |
| 2018/0095584 A1 | 4/2018 | Lee et al. | |
| 2018/0159077 A1 | 6/2018 | Lee et al. | |
| 2018/0166525 A1 | 6/2018 | Kim et al. | |
| 2018/0182816 A1 | 6/2018 | Kang et al. | |
| 2018/0182818 A1 | 6/2018 | Kim | |
| 2018/0204886 A1 | 7/2018 | Lee et al. | |
| 2018/0226454 A1 | 8/2018 | Miu et al. | |
| 2019/0221634 A1 | 7/2019 | Kim et al. | |
| 2020/0219965 A1 | 7/2020 | Kim et al. | |
| 2020/0264722 A1 | 8/2020 | Lee et al. | |
| 2021/0288130 A1 | 9/2021 | Kim et al. | |
| 2021/0296615 A1 | 9/2021 | Lee et al. | |
| 2022/0236825 A1 | 7/2022 | Lee et al. | |
| 2023/0140524 A1 | 5/2023 | Kim et al. | |

FOREIGN PATENT DOCUMENTS

| | | |
|---|---|---|
| CN | 107665062 A | 2/2018 |
| CN | 108155216 A | 6/2018 |
| CN | 108155300 A | 6/2018 |
| CN | 108172593 A | 6/2018 |
| EP | 3301550 A1 | 4/2018 |
| KR | 10-2018-0014396 A | 2/2018 |

OTHER PUBLICATIONS

European Patent Office, Extended European Search Report, EP Patent Application No. 19208057.0, dated Mar. 26, 2020, nine pages.

United States Office Action, U.S. Appl. No. 16/664,603, dated Nov. 24, 2020, 15 pages.

United States Office Action, U.S. Appl. No. 17/345,974, dated Feb. 8, 2022, eight pages.

China National Intellectual Property Administration, Office Action, CN Patent Application No. 201911023622.5, dated Mar. 26, 2023, 16 pages.

Korean Intellectual Property Office, Office Action, Korean Patent Application No. 10-2018-0137407, dated Jul. 11, 2023, 7 pages, (with concise explanation of relevance).

China National Intellectual Property Administration, Second Office Action, Chinese Patent Application No. 201911023622.5, dated Aug. 26, 2023, 18 pages.

* cited by examiner

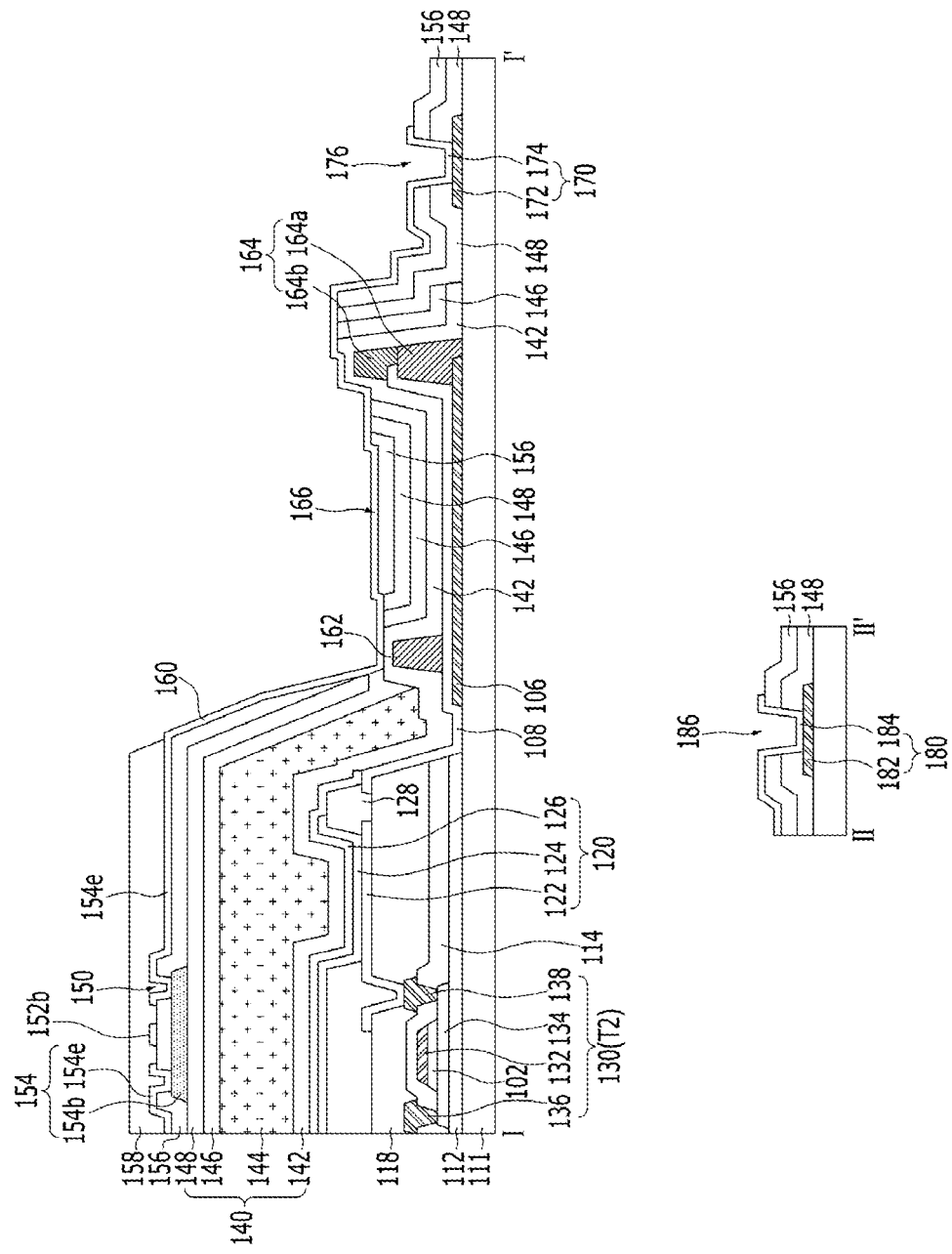

FIG.5B
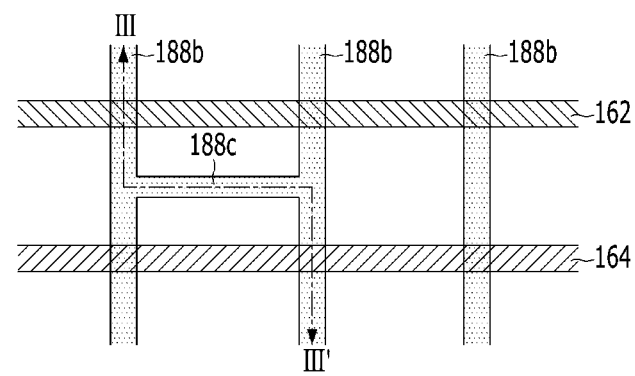
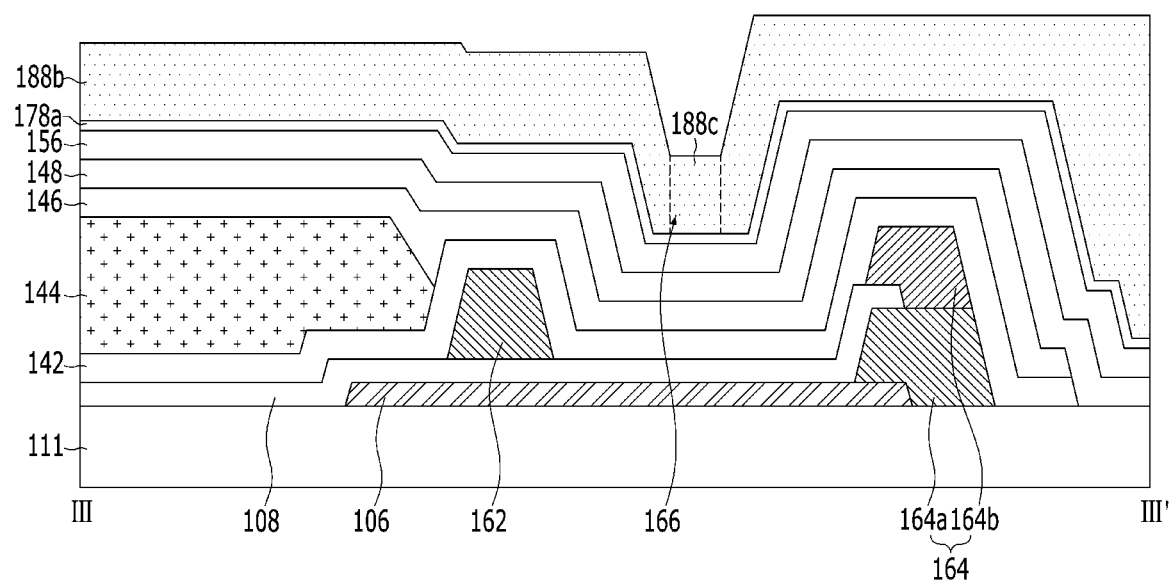

FIG.5C
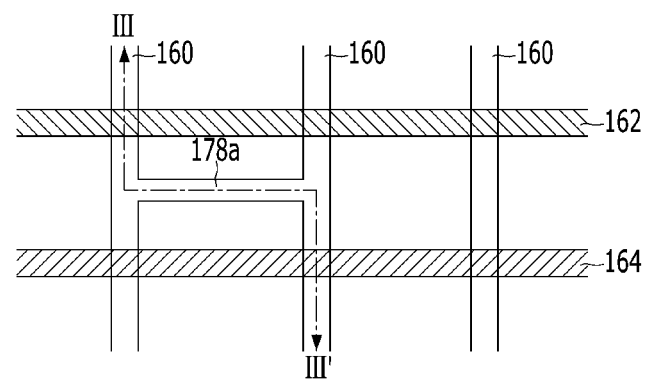
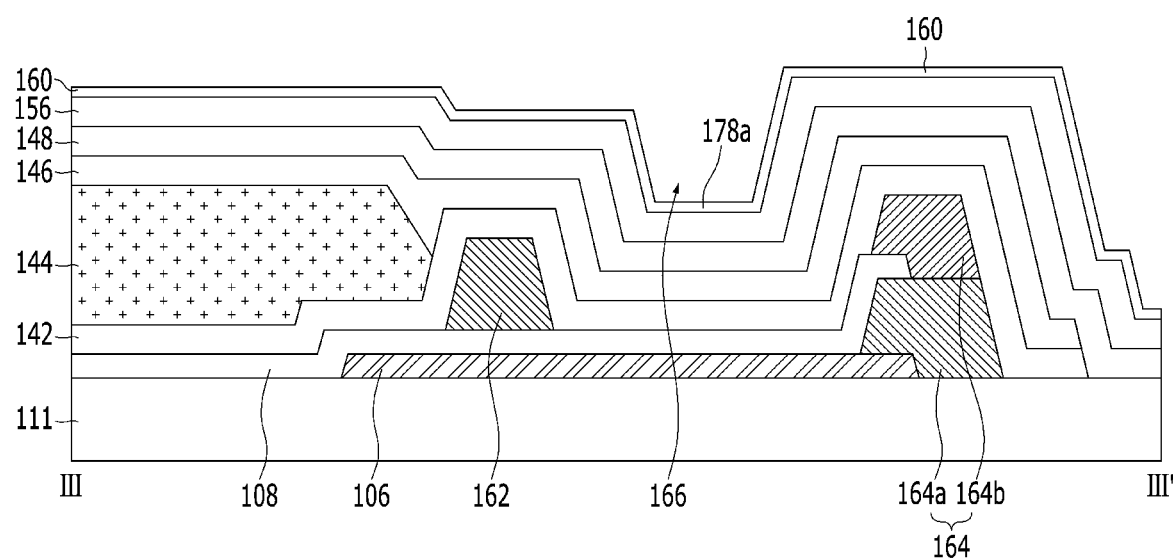

FIG.6C
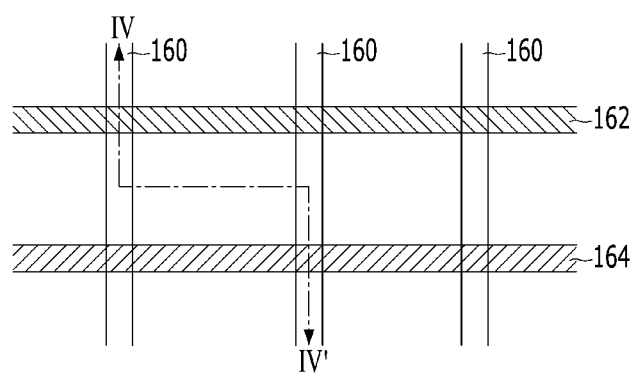
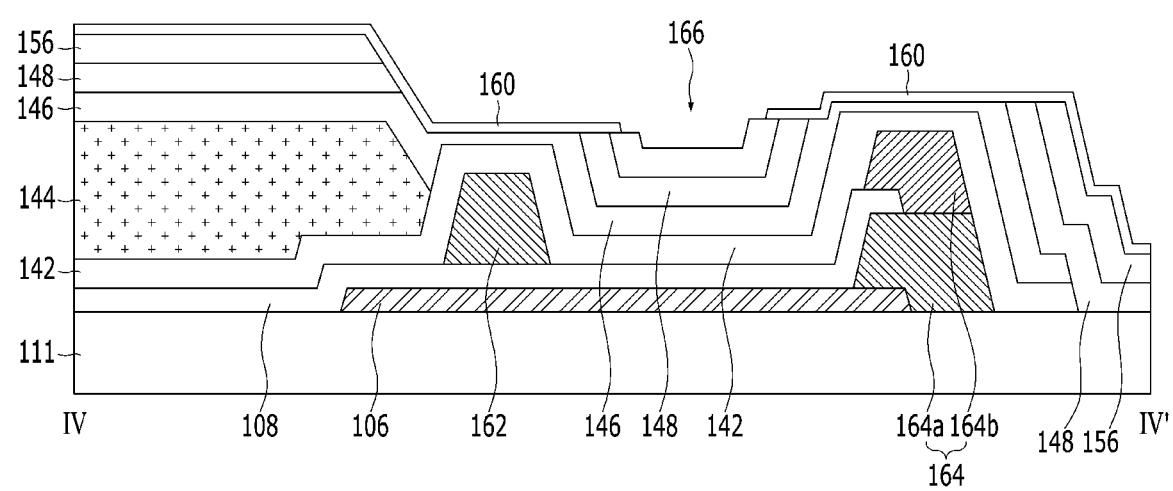

DISPLAY DEVICE

CROSS-REFERENCE TO RELATED APPLICATIONS

This application is a continuation application of patent application Ser. No. 17/345,974, filed on Jun. 11, 2021, which is a continuation application of U.S. patent application Ser. No. 16/664,603, filed on Oct. 25, 2019, which claims the benefit of Republic of Korea Patent Application No. 10-2018-0137407, filed on Nov. 9, 2018, all of which are hereby incorporated by reference as if fully set forth herein.

FIELD

The present disclosure relates to a display device, and more particularly to a display device for improving productivity.

BACKGROUND

A touchscreen is an input device through which a user may input a command by selecting instructions displayed on a screen of a display device using a hand or an object. That is, the touchscreen converts a contact position that directly contacts a human hand or an object into an electrical signal and receives selected instructions based on the contact position as an input signal. Such a touchscreen may substitute for a separate input device that is connected to a display device and operated, such as a keyboard or a mouse, and thus the range of application of the touchscreen has continually increased.

Accordingly, many attempts are being made to install a touchscreen in a display panel, such as a liquid crystal display panel or an organic light-emitting display panel, in order to improve productivity of display devices or reduce the size thereof.

When a touchscreen is installed in an organic light-emitting display panel, signal lines of the touchscreen are disposed on dams of the organic light-emitting display panel. In this case, however, a residual film of a photoresist for forming the touchscreen is highly likely to be left behind in a deep trench between the dams. If an exposure is increased in order to prevent a residual film of a photoresist for forming the touchscreen from being left behind, productivity is deteriorated.

SUMMARY

Accordingly, the present disclosure is directed to a display device that substantially obviates one or more problems due to limitations and disadvantages of the related art.

An object of the present disclosure is to provide a display device for improving productivity.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the disclosure, as embodied and broadly described herein, according to one aspect of the disclosure, a display device comprises a light-emitting element disposed in an active area of a substrate, a touch sensor disposed on the light-emitting element, an encapsulation unit disposed between the light-emitting element and the touch sensor, the encapsulation unit comprising a plurality of inorganic encapsulation layers and at least one organic encapsulation layer disposed between the inorganic encapsulation layers, a touch pad disposed in a pad area of the substrate, the touch pad being connected to the touch sensor via a routing line, and a first dam and a second dam disposed between the active area and the pad area, wherein a total thickness of at least one inorganic insulation layer disposed on a region above each of the first and second dams is different from a total thickness of the at least one inorganic insulation layer disposed in a trench region between the first dam and the second dam, whereby a photoresist for forming a routing line is formed so as to have a uniform thickness on the region above each of the dams and the trench region between the dams, and thus productivity is improved.

According to other aspect of the disclosure, it is to provide a display device comprising a light-emitting element disposed in an active area of a substrate, a touch sensor disposed on the light-emitting element, an encapsulation unit disposed between the light-emitting element and the touch sensor, the encapsulation unit comprising a plurality of inorganic encapsulation layers and at least one organic encapsulation layer disposed between the inorganic encapsulation layers, a touch pad disposed in a pad area of the substrate, the touch pad being connected to the touch sensor via a routing line, a first dam and a second dam disposed between the active area and the pad area, a low-voltage supply line disposed on the substrate and below the first dam and the second dam, and an auxiliary electrode disposed between the low-voltage supply line and the first and second dams and electrically connecting the low-voltage supply line and a cathode of the light-emitting element, wherein the second dam includes a first sub-dam and a second sub-dam, and the auxiliary electrode is partially disposed between the first sub-dam and the second sub-dam.

It is to be understood that both the foregoing general description and the following detailed description of the present disclosure are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

FIG. 4 is a cross-sectional view illustrating an organic light-emitting display device having a touch sensor according to a second embodiment of the present disclosure.

FIGS. 5A to 5C are cross-sectional views illustrating a method of manufacturing a comparative example in which first and second inorganic encapsulation layers, a touch buffer film, and a touch insulation film are disposed on the first and second dams illustrated in FIG. 4.

FIGS. 6A to 6C are cross-sectional views illustrating a method of manufacturing an embodiment in which at least one of a first inorganic encapsulation layer and a second inorganic encapsulation layer is disposed on the first and second dams illustrated in FIG. 4 according to an embodiment of the present disclosure.

DETAILED DESCRIPTION

Reference will now be made in detail to exemplary embodiments of the present disclosure, examples of which are illustrated in the accompanying drawings. Wherever possible, the same reference numbers will be used throughout the drawings to refer to the same or like parts.

Figure 1:
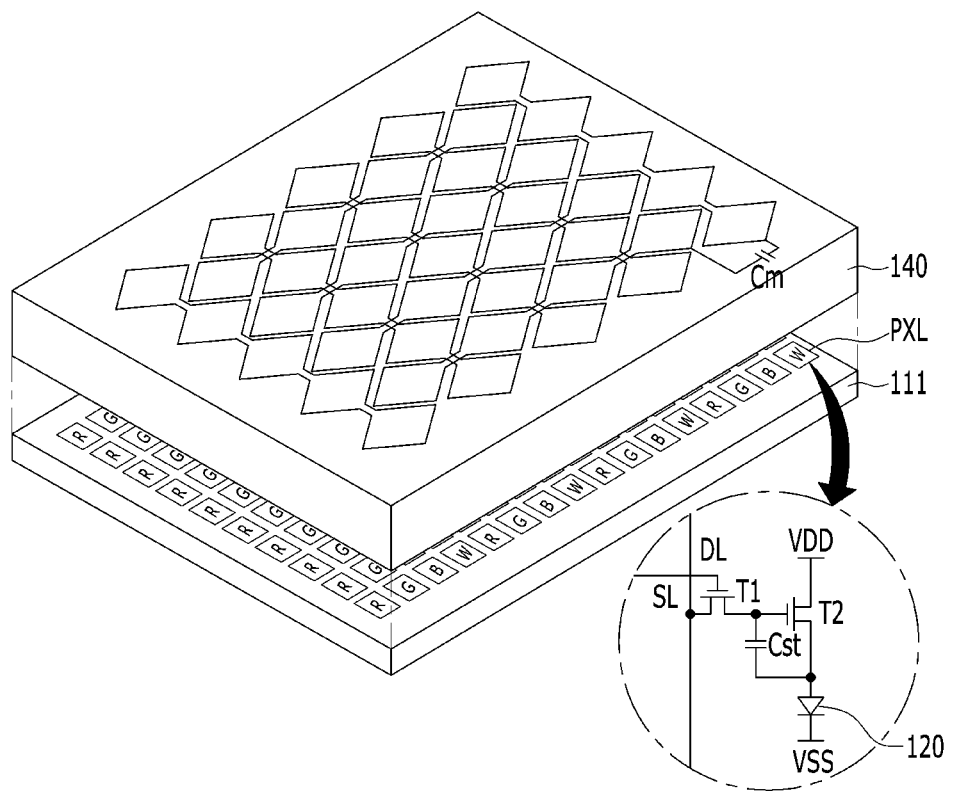
FIG. 1 is a perspective view illustrating an organic light-emitting display device having a touch sensor according to an embodiment of the present disclosure.

FIG. 1 is a perspective view illustrating an organic light-emitting display device having a touch sensor according to an embodiment of the present disclosure.

Figure 2:
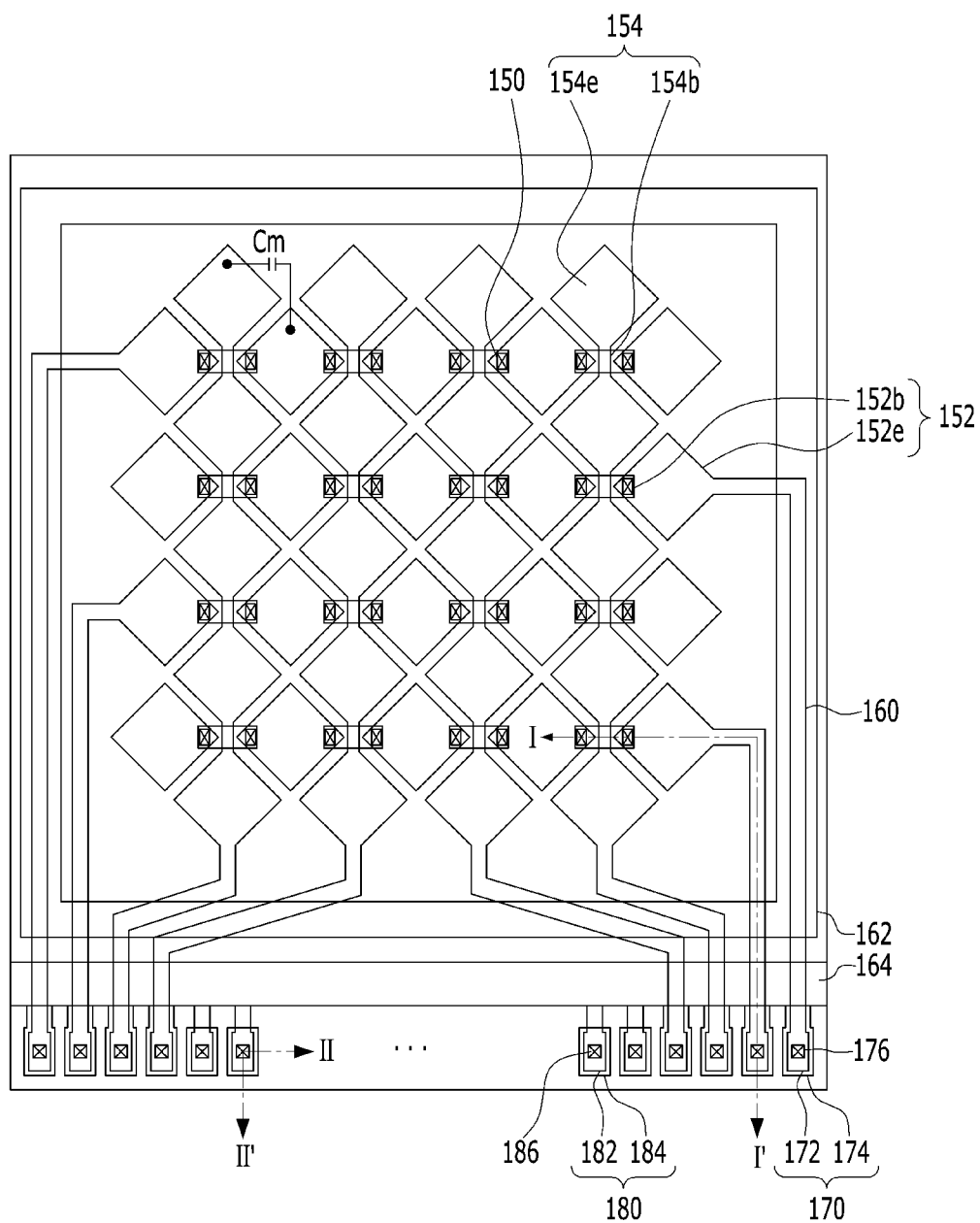
FIG. 2 is a plan view illustrating an organic light-emitting display device having a touch sensor according to a first embodiment of the present disclosure.

The organic light-emitting display device having a touch sensor illustrated in FIG. 1 senses the presence or absence of a touch and a touch position by sensing a variation in mutual capacitance Cm (touch sensor) in response to a user touch via touch electrodes 152e and 154e illustrated in FIG. 2 for a touch period. Then, the organic light-emitting display device having a touch sensor illustrated in FIG. 1 displays an image via unit pixels each including a light-emitting element 120. Each unit pixel may include red (R), green (G), and blue (B) subpixels PXL, or may include red (R), green (G), blue (B), and white (W) subpixels PXL.

To this end, the organic light-emitting display device illustrated in FIG. 1 includes a plurality of subpixels PXL arranged in a matrix form on a substrate 111, an encapsulation unit 140 disposed on the subpixels PXL, and a mutual capacitance array Cm disposed on the encapsulation unit 140.

Each of the subpixels PXL includes a pixel-driving circuit and the light-emitting element 120 connected to the pixel-driving circuit.

The pixel-driving circuit includes a switching transistor T1, a driving transistor T2, and a storage capacitor Cst. In the present disclosure, a structure in which the pixel-driving circuit includes two transistors T and one capacitor C is described by way of example, but the present disclosure is not limited thereto. That is, a pixel-driving circuit having a structure in which three or more transistors T and one or more capacitors C are provided, such as a 3T1C structure or 3T2C structure, may be used.

The switching transistor T1 is turned on when a scan pulse is supplied to a scan line SL, and supplies a data signal supplied to a data line DL to the storage capacitor Cst and a gate electrode of the driving transistor T2.

The driving transistor T2 controls the current I to be supplied from a high-voltage (VDD) supply line to the light-emitting element 120 in response to the data signal supplied to the gate electrode of the driving transistor T2, thereby adjusting the amount of light emitted from the light-emitting element 120. Then, even if the switching transistor T1 is turned off, the driving transistor T2 maintains the emission of light by the light-emitting element 120 by supplying a constant amount of current thereto using the voltage charged in the storage capacitor Cst until a data signal of a next frame is supplied.

Figure 3:
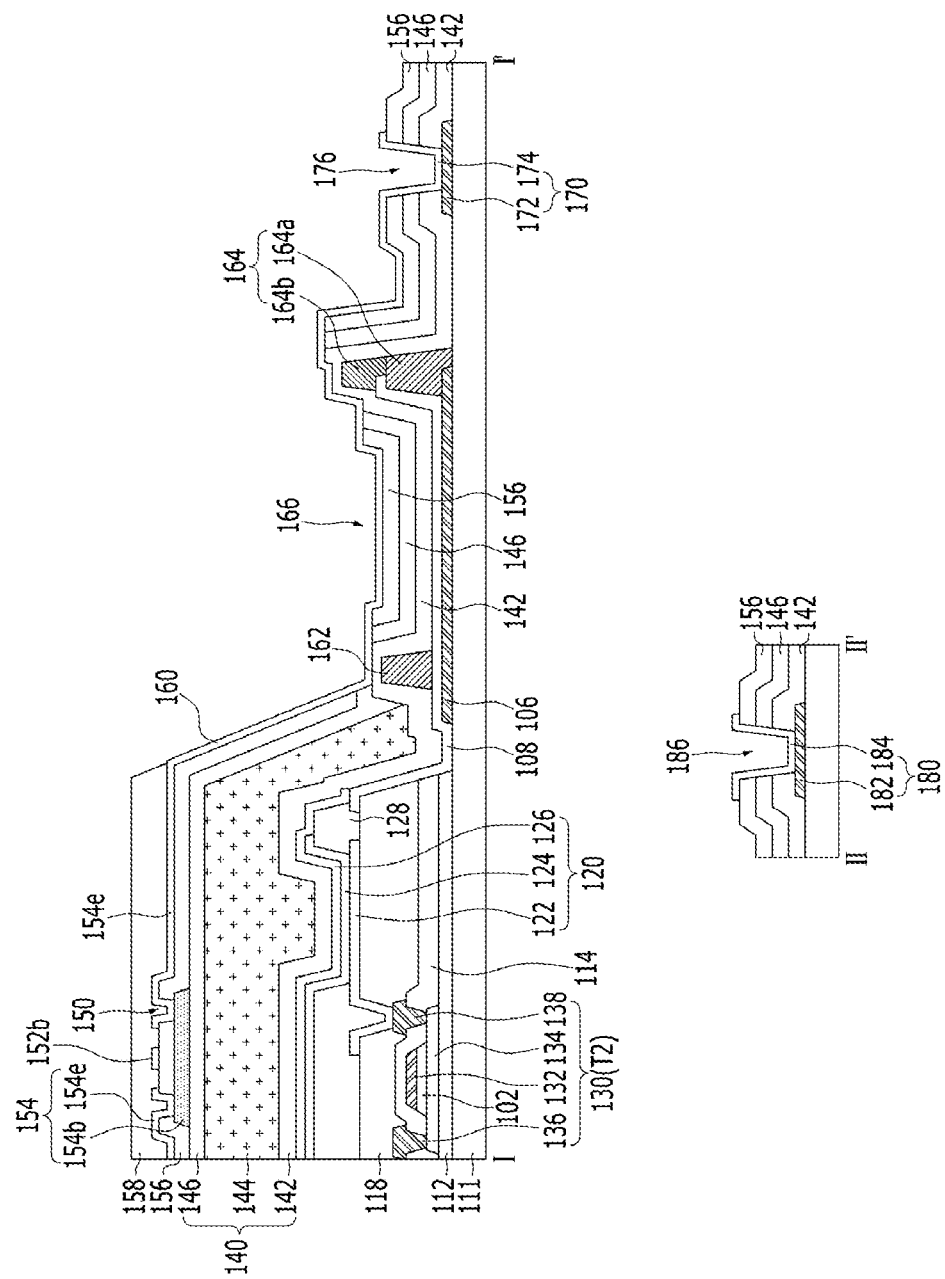
FIG. 3 illustrates cross-sectional views taken along lines I-I' and II-II' in FIG. 2 according to an embodiment of the present disclosure.

The driving thin-film transistor T2 or 130, as illustrated in FIG. 3, includes a semiconductor layer 134 disposed on a buffer layer 112, a gate electrode 132 overlapping the semiconductor layer 134 with a gate insulation film 102 interposed therebetween, and a source electrode 136 and a drain electrode 138 formed on an interlayer insulation film 114 so as to come into contact with the semiconductor layer 134. Here, the semiconductor layer 134 is formed of at least one of an amorphous semiconductor material, a polycrystalline semiconductor material, or and an oxide semiconductor material.

The light-emitting element 120 includes an anode 122, at least one light-emitting stack 124 formed on the anode 122, and a cathode 126 formed on the light-emitting stack 124.

The anode 122 is electrically connected to the drain electrode 138 of the driving thin-film transistor T2 or 130, which is exposed through a pixel contact hole formed through a pixel planarization layer 118.

The light-emitting stack 124 is formed on the anode 122 in a light-emitting area that is defined by a bank 128. The light-emitting stack 124 is formed by stacking a hole-related layer, an organic emission layer, and an electron-related layer on the anode 122 in that order or in the reverse order. In addition, the light-emitting stack 124 may include first and second light-emitting stacks, which face each other with a charge generation layer interposed therebetween. In this case, the organic emission layer of any one of the first and second light-emitting stacks generates blue light, and the organic emission layer of the other one of the first and second light-emitting stacks generates yellow-green light, whereby white light is generated via the first and second light-emitting stacks. Since the white light generated in the light-emitting stack 124 is incident on a color filter located above or under the light-emitting stack 124, a color image may be realized. In addition, colored light corresponding to each subpixel may be generated in each light-emitting stack 124 to realize a color image without a separate color filter. That is, the light-emitting stack 124 of the red (R) subpixel may generate red light, the light-emitting stack 124 of the green (G) subpixel may generate green light, and the light-emitting stack 124 of the blue (B) subpixel may generate blue light.

The cathode 126 may be formed so as to face the anode 122 with the light-emitting stack 124 interposed therebetween. The cathode 126 is connected to a low-voltage (VSS) supply line 106 via an auxiliary electrode 108. The low-voltage (VSS) supply line 106 is formed of the same material as the source and drain electrodes 136 and 138 on the substrate 111. The auxiliary electrode 108 is disposed between the low-voltage (VSS) supply line 106 and the cathode 126 and electrically connects the low-voltage (VSS) supply line 106 and the cathode 126 to each other. The auxiliary electrode 108 is formed of the same material as the anode 122.

The encapsulation unit 140 prevents external moisture or oxygen from entering the light-emitting element 120, which is vulnerable to the external moisture or oxygen. To this end, the encapsulation unit 140 includes a plurality of inorganic encapsulation layers 142 and 146 and an organic encapsulation layer 144 disposed between the inorganic encapsulation layers 142 and 146. The inorganic encapsulation layer 146 is the uppermost layer. Here, the encapsulation unit 140 includes at least two inorganic encapsulation layers 142 and 146 and at least one organic encapsulation layer 144. In the present disclosure, the structure of the encapsulation unit 140 in which the organic encapsulation layer 144 is disposed between the first and second inorganic encapsulation layers 142 and 146 will be described by way of example, but is not limited hereto.

The first inorganic encapsulation layer 142 is formed on the substrate 111, on which the cathode 126 has been formed, so as to be closest to the light-emitting element 120. The first inorganic encapsulation layer 142 is formed of an inorganic insulation material that is capable of being deposited at a low temperature, such as silicon nitride (SiNx), silicon oxide (SiOx), silicon oxide nitride (SiON), or aluminum oxide ($Al_2O_3$). Thus, since the first inorganic encapsulation layer 142 is deposited in a low-temperature atmosphere, it is possible to prevent damage to the light-emitting stack 124, which is vulnerable to a high-temperature atmosphere, during the process of depositing the first inorganic encapsulation layer 142.

The organic encapsulation layer 144 serves to dampen the stress between the respective layers due to bending of the organic light-emitting display device and to increase planarization performance. The organic encapsulation layer 144 is formed of an organic insulation material, such as acryl resin, epoxy resin, polyimide, polyethylene, or silicon oxycarbide (SiOC).

If the organic encapsulation layer 144 is formed through an inkjet method, a plurality of dams 162 and 164 is formed in order to prevent the organic encapsulation layer 144 in a liquid state from invading the edge area of the substrate 111. The dams 162 and 164 are disposed closer to the edge area of the substrate 111 than the organic encapsulation layer 144. The dams 162 and 164 may prevent the organic encapsulation layer 144 from invading a pad area, which is disposed at the edge area of the substrate 111 and in which a touch pad 170 and a display pad 180 are disposed. To this end, as illustrated in FIG. 2, the dams 162 and 164 may be formed so as to completely surround an active area, in which the light-emitting element 120 is disposed, or may be formed only between the active area and the pad area. In the case in which the pad area in which the touch pad 170 and the display pad 180 are disposed at one side of the substrate 111, the dams 162 and 164 may be disposed only at the one side of the substrate 111. In the case in which the pad area in which the touch pad 170 and the display pad 180 are disposed at either side of the substrate 111, the dams 162 and 164 are disposed at either side of the substrate 111. Here, the dams 162 and 164, which are spaced a predetermined distance apart from each other, may be disposed parallel to each other. As illustrated in FIGS. 2 and 3, in the present disclosure, the structure in which the dams include a closed-type first dam 162 surrounding the active area and a second dam 164 disposed between the first dam 162 and the pad area has been described by way of example, but the present disclosure is not limited thereto.

Each of the first and second dams 162 and 164 is formed to have a single-layer or multi-layer structure. The second dam 164, which is relatively close to the touch pad 170 and the display pad 180, is formed to be higher than the first dam 162, which is relatively farther away from the touch pad 170 and the display pad 180. To this end, the first dam 162 may be formed of the same material as one of the pixel planarization layer 118 and the bank 128 and is formed simultaneously therewith. The second dam 164 may include a first sub-dam 164a, which is formed of the same material as the pixel planarization layer 118 and is formed simultaneously therewith, and a second sub-dam 164b, which is formed of the same material as the bank 128 and is formed simultaneously therewith on the first sub-dam 164a. The auxiliary electrode 108 may be disposed between the first and second sub-dams 164a and 164b so that the difference in height between the upper surface of the second dam 164 and the upper surface of the first dam 162 becomes large.

The second inorganic encapsulation layer 146 is formed on the substrate 111, on which the organic encapsulation layer 144 has been formed, so as to cover the upper surface and the side surface of each of the organic encapsulation layer 144 and the first inorganic encapsulation layer 142. Thus, the second inorganic encapsulation layer 146 minimizes or prevents the entry of external moisture or oxygen into the first inorganic encapsulation layer 142 and the organic encapsulation layer 144. The second inorganic encapsulation layer 146 is formed of an inorganic insulation material, such as silicon nitride (SiNx), silicon oxide (SiOx), silicon oxide nitride (SiON), or aluminum oxide ($Al_2O_3$).

During the formation of a second bridge 154b, at least one of the first and second inorganic encapsulation layers 142 and 146 is disposed so as to cover a lower touch pad electrode 172 and a lower display pad electrode 182, which are formed of the same material as the second bridge 154b. In this case, at least one of the first and second inorganic encapsulation layers 142 and 146 prevents the lower touch pad electrode 172 and the lower display pad electrode 182 from being exposed to the outside during the formation of the second bridge 154b. Thus, during the process of etching the second bridge 154b, at least one of the first and second inorganic encapsulation layers 142 and 146 prevents the lower touch pad electrode 172 and the lower display pad electrode 182 from being etched, thereby preventing damage to the lower touch pad electrode 172 and the lower display pad electrode 182.

A touch sensor (mutual capacitance Cm), which includes a touch insulation film 156 and further includes a touch-sensing line 154 and a touch-driving line 152, which are disposed so as to intersect each other with the touch insulation film 156 interposed therebetween, is disposed on the encapsulation unit 140. The touch sensor charges an electric charge using a touch-driving pulse supplied to the touch-driving line 152 and discharges the electric charge to the touch-sensing line 154.

The touch-driving line 152 includes a plurality of first touch electrodes 152e and first bridges 152b electrically connecting the first touch electrodes 152e.

The first touch electrodes 152e are spaced apart from each other at regular intervals in the X-axis direction, which is the first direction, on the touch insulation film 156. Each of the first touch electrodes 152e is electrically connected to an adjacent first touch electrode 152e via the first bridge 152b.

The first bridge 152b may be disposed on the touch insulation film 156 in the same plane as the second touch electrode 154e and is electrically connected to the second touch electrode 154e without a separate contact hole. Since the first bridge 152b is disposed so as to overlap the bank 128, it is possible to prevent the aperture ratio from being deteriorated by the first bridge 152b.

The touch-sensing line 154 includes a plurality of second touch electrodes 154e and second bridges 154b electrically connecting the second touch electrodes 154e.

The second touch electrodes 154e are spaced apart from each other at regular intervals in the Y-axis direction, which is the second direction, on the touch insulation film 156. Each of the second touch electrodes 154e is electrically connected to an adjacent second touch electrode 154e via the second bridge 154b.

The second bridge 154b is formed on the second inorganic encapsulation layer 146 and is exposed through a touch contact hole 150, which penetrates the touch insulation film 156, so as to be electrically connected to the first touch electrode 152e. Like the first bridge 152b, the second bridge 154b is disposed so as to overlap the bank 128, thereby preventing the aperture ratio from being deteriorated by the second bridge 154b.

A touch protective film 158 is formed so as to cover the first and second touch electrodes 152e and 154e, the first and second bridges 152b and 154b, and a portion of a routing line 160. The touch protective film 158 prevents the first and second touch electrodes 152e and 154e and the first and second bridges 152b and 154b from being damaged by external shocks, moisture, or the like. In addition, the touch protective film 158 is formed so as to expose the display pad 180 and the touch pad 170. The touch protective film 158 may be formed of an organic insulation material such as epoxy or acrylic, or may be formed of a polarizing film.

Each of the touch-driving line 152 and the touch-sensing line 154 is connected to a touch-driving unit (not illustrated) via the routing line 160 and the touch pad 170.

The touch pad 170 is connected to a signal transmission film (not illustrated), on which the touch-driving unit is installed. The touch pad 170 includes a lower touch pad electrode 172 and an upper touch pad electrode 174.

The lower touch pad electrode 172 is disposed on at least one of the substrate 111, the buffer layer 112, and the interlayer insulation film 114, which is disposed under the encapsulation unit 140. For example, the lower touch pad electrode 172 is disposed on the substrate 111 so as to be in contact with the substrate 111. The lower touch pad electrode 172 is formed of the same material and in the same plane as at least one of the gate electrode 132 and the source and drain electrodes 136 and 138 of the driving transistor T2 or 130 so as to have a single-layer or multi-layer structure. For example, since the lower touch pad electrode 172 is formed of the same material as the source and drain electrodes 136 and 138 on the substrate 111, the lower surface of the lower touch pad electrode 172 comes into contact with the substrate 111.

The upper touch pad electrode 174 is electrically connected to the lower touch pad electrode 172, which is exposed through a touch pad contact hole 176 that penetrates the first and second inorganic encapsulation layers 142 and 146 and the touch insulation film 156. The upper touch pad electrode 174 is formed of the same material as the routing line 160 and is formed through the same mask process as the routing line 160. Since the upper touch pad electrode 174 extends from the routing line 160, the upper touch pad electrode 174 is electrically connected to the routing line 160 without a separate contact hole.

The display pad 180 is also disposed in a non-active (bezel) area, in which the touch pad 170 is disposed. For example, as illustrated in FIG. 2, the display pads 180 may be disposed between the touch pads 170, or the touch pads 170 may be disposed between the display pads 180. Alternatively, the touch pad 170 may be disposed at one side of the display panel, and the display pad 180 may be disposed at the opposite side of the display panel. The arrangement of the touch pad 170 and the display pad 180 is not limited to the structure illustrated in FIG. 2, but may be variously changed depending on the design choices made for the display device.

The display pad 180 may be formed in a different stacking structure from the touch pad 170, or may be formed in the same stacking structure as the touch pad 170, as illustrated in FIG. 3.

That is, the display pad 180 illustrated in FIG. 3 includes the lower display pad electrode 182 and the upper display pad electrode 184.

The lower display pad electrode 182 is formed so as to be connected to at least one signal line of the scan line SL, the data line DL, the low-voltage (VSS) supply line 106, and the high-voltage (VDD) supply line within the active area, in which the light-emitting element 120 is formed. The lower display pad electrode 182 is formed of the same material as at least one of the gate electrode 132 and the source and drain electrodes 136 and 138 of the driving transistor T2 or 130 and is formed in a single-layer or multi-layer structure on the substrate 111. For example, like the lower touch pad electrode 172, the lower display pad electrode 182 is formed on the substrate 111 and is formed of the same material as the source and drain electrodes 136 and 138.

The upper display pad electrode 184 is electrically connected to the lower display pad electrode 182, which is exposed through a display pad contact hole 186 that penetrates the first and second inorganic encapsulation layers 142 and 146 and the touch insulation film 156. The upper display pad electrode 184 is formed of the same material as the routing line 160 and is formed through the same mask process as the routing line 160.

The routing line 160 transmits a touch-driving pulse generated in the touch-driving unit to the touch-driving line 152 via the touch pad 170 and transmits a touch signal from the touch-sensing line 154 to the touch-driving unit via the touch pad 170. Thus, the routing line 160 is formed between each of the first and second touch electrodes 152e and 154e and the touch pad 170, and electrically connects each of the first and second touch electrodes 152e and 154e and the touch pad 170 to each other. Here, as illustrated in FIG. 2, the routing line 160 extends from the first touch electrode 152e to at least one of the left side and the right side of the active area AA and is connected to the touch pad 170. In addition, the routing line 160 extends from the second touch electrode 154e to at least one of the upper side and the lower side of the active area and is connected to the touch pad 170. The arrangement of the routing line 160 may be variously changed depending on the design choices made for the display device.

The routing line 160 is disposed so as to intersect the first and second dams 162 and 164 above the first and second dams 162 and 164.

Here, the total thickness of at least one inorganic insulation layer disposed on the first and second dams 162 and 164 is different from the total thickness of the at least one inorganic insulation layer disposed in a trench region formed between the first and second dams 162 and 164. That is, the total thickness of the at least one inorganic insulation layer disposed between each of the first and second dams 162 and 164 and the routing line 160 is less than the total thickness of the at least one inorganic insulation layer disposed between the auxiliary electrode 108, which is exposed between the first and second dams 162 and 164, and the routing line 160. To this end, the total number of the at least one inorganic insulation layer disposed between each of the first and second dams 162 and 164 and the routing line 160 is less than the total number of the at least one inorganic insulation layer disposed between the auxiliary electrode 108, which is exposed between the first and second dams 162 and 164, and the routing line 160. Specifically, the first and second inorganic encapsulation layers 142 and 146 and the touch insulation film 156 are disposed between the auxiliary electrode 108, which is exposed between the first and second dams 162 and 164, and the routing line 160, and one of the first and second inorganic encapsulation layers 142 and 146 and the touch insulation film 156 is disposed between each of the first and second dams 162 and 164 and the routing line 160. If no inorganic insulation film is disposed between each of the first and second dams 162 and 164 and the routing line 160, external moisture or oxygen may be introduced thereinto. Therefore, one of the first and second inorganic encapsulation layers 142 and 146 and the touch insulation film 156 needs to be disposed between each of the first and second dams 162 and 164 and the routing line 160. In the present disclosure, the structure in which the first inorganic encapsulation layer 142 is disposed between each of the first and second dams 162 and 164 and the routing line 160 will be described below by way of example. Here, the first inorganic encapsulation layer 142 disposed between each of the first and second dams 162 and 164 and the routing line 160 is formed to have a thickness that is equal to or less than the thickness of the first inorganic encapsulation layer 142 disposed between the auxiliary electrode 108, which is exposed between the first and second dams 162 and 164, and the routing line 160. Thus, the unevenness between the trench region 166, which is formed between the first and second dams 162 and 164, and the region above each of the first and second dams 162 and 164 is minimized. As a result, it is possible to prevent electrical short-circuit or disconnection of the routing line 160, which is formed across the trench region 166 between the first and second dams 162 and 164 and the region above each of the first and second dams 162 and 164.

FIG. 4 is a cross-sectional view illustrating an organic light-emitting display device having a touch sensor according to a second embodiment of the present disclosure.

The organic light-emitting display device having the touch sensor illustrated in FIG. 4 has the same constituent components as the organic light-emitting display device having the touch sensor illustrated in FIG. 3, except that a touch buffer film 148 is further provided. A detailed explanation of the same constituent components will be omitted for the sake of brevity.

The touch buffer film 148 illustrated in FIG. 4 is disposed between the second inorganic encapsulation layer 146, which is disposed at the uppermost portion of the encapsulation unit 140, and the second bridge 154*b*, which is disposed at the lowermost portion of the touch sensor. The spacing distance between each of the touch-sensing line 154 and the touch-driving line 152 and the light-emitting element 120 is increased by the touch buffer film 148. Thus, the capacity of a parasitic capacitor formed between each of the touch-sensing line 154 and the touch-driving line 152 and the light-emitting element 120 may be minimized, and mutual interaction due to coupling between each of the touch-sensing line 154 and the touch-driving line 152 and the light-emitting element 120 may be prevented.

In addition, during the formation of the second bridge 154*b*, the touch buffer film 148 is disposed so as to cover the lower touch pad electrode 172 and the lower display pad electrode 182, which are formed of the same material as the second bridge 154*b*. In this case, the touch buffer film 148 prevents the lower touch pad electrode 172 and the lower display pad electrode 182 from being exposed to the outside during the formation of the second bridge 154*b*. Thus, during the process of etching the second bridge 154*b*, the lower touch pad electrode 172 and the lower display pad electrode 182 are prevented from being etched, thereby preventing damage to the lower touch pad electrode 172 and the lower display pad electrode 182.

As such, the lower touch pad electrode 172 and the lower display pad electrode 182 illustrated in FIG. 4 are protected by the touch buffer film 148 during the process of etching the second bridge 154*b*. Thus, the touch pad 170 and the display pad 180 do not overlap the first and second inorganic encapsulation layers 142 and 146.

Thus, as illustrated in FIG. 4, the display pad 180 includes the lower display pad electrode 182 and the upper display pad electrode 184, which are connected to each other via the display pad contact hole 186 that penetrates the touch buffer film 148 and the touch insulation film 156.

The touch pad 170 includes the lower touch pad electrode 172 and the upper touch pad electrode 174, which are connected to each other via the touch pad contact hole 176 that penetrates the touch buffer film 148 and the touch insulation film 156.

The routing line 160, which is connected to the upper touch pad electrode 174, is disposed so as to intersect the first and second dams 162 and 164 above the first and second dams 162 and 164.

Here, the total thickness of at least one thin-film layer disposed between each of the first and second dams 162 and 164 and the routing line 160 is less than the total thickness of the at least one thin-film layer disposed between the auxiliary electrode 108, which is exposed between the first and second dams 162 and 164, and the routing line 160. For example, the first and second inorganic encapsulation layers 142 and 146, the touch buffer film 148 and the touch insulation film 156 are disposed between the auxiliary electrode 108, which is exposed between the first and second dams 162 and 164, and the routing line 160, and one of the first and second inorganic encapsulation layers 142 and 146, the touch buffer film 148, and the touch insulation film 156 is disposed between each of the first and second dams 162 and 164 and the routing line 160. For example, in the embodiment shown in FIG. 4, the first inorganic encapsulation layer 142 is disposed between each of the first and second dams 162 and 164 and the routing line 160.

Thus, the unevenness between the trench region 166, which is formed between the first and second dams 162 and 164, and the region above each of the first and second dams 162 and 164 is minimized. As a result, it is possible to prevent electrical short-circuit or disconnection of the routing line 160, which is formed across the trench region 166 between the first and second dams 162 and 164 and the region above each of the first and second dams 162 and 164.

Figure 5A:
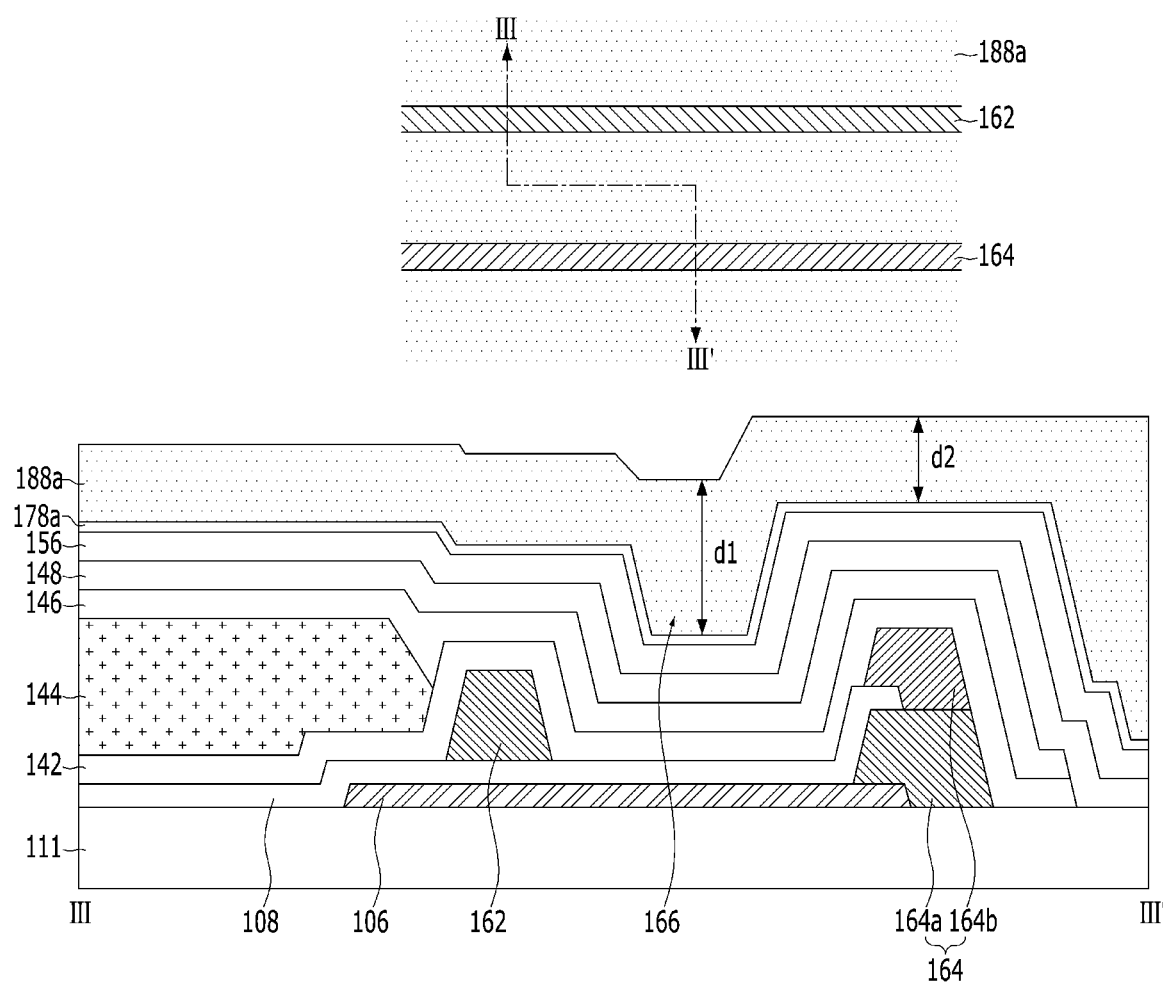
Figure 6A:
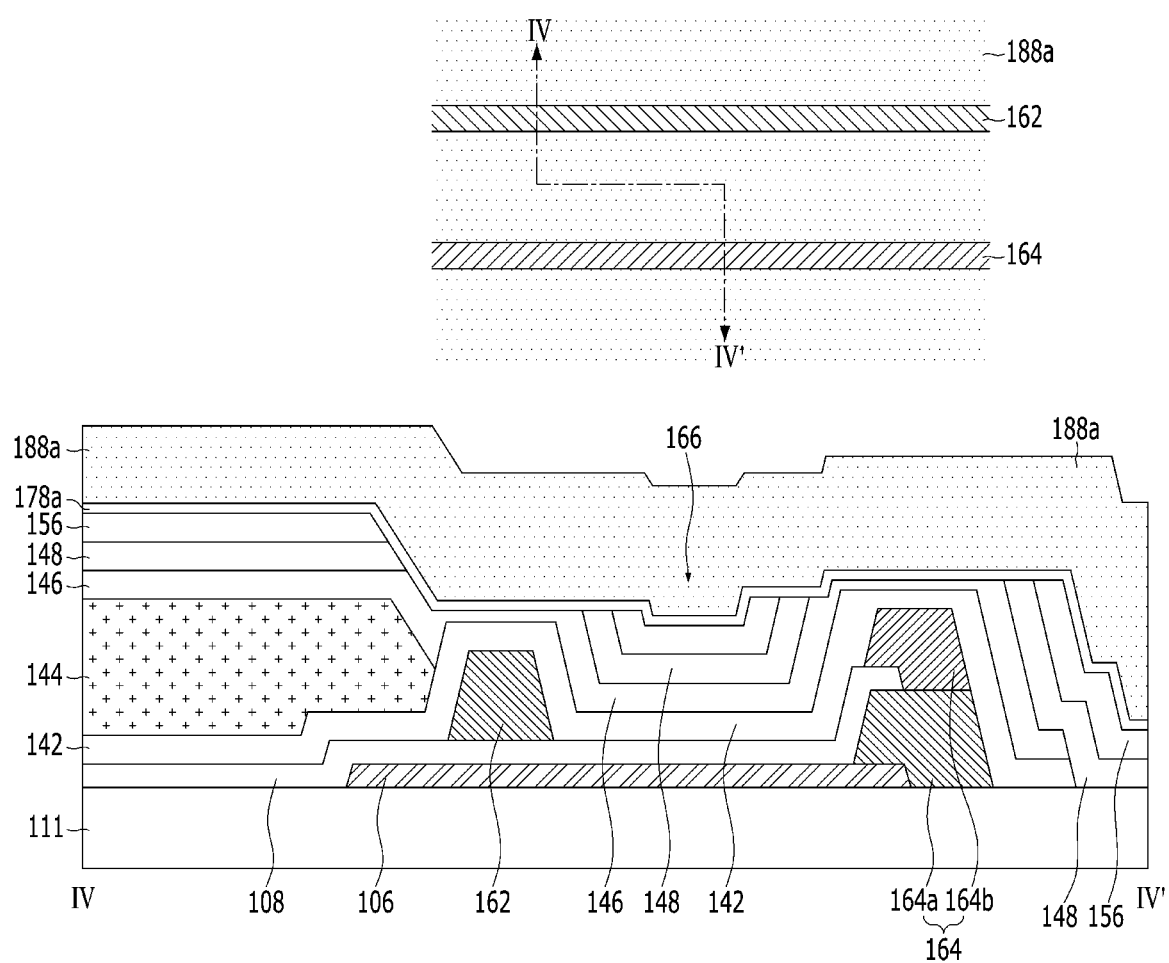
Figure 6B:
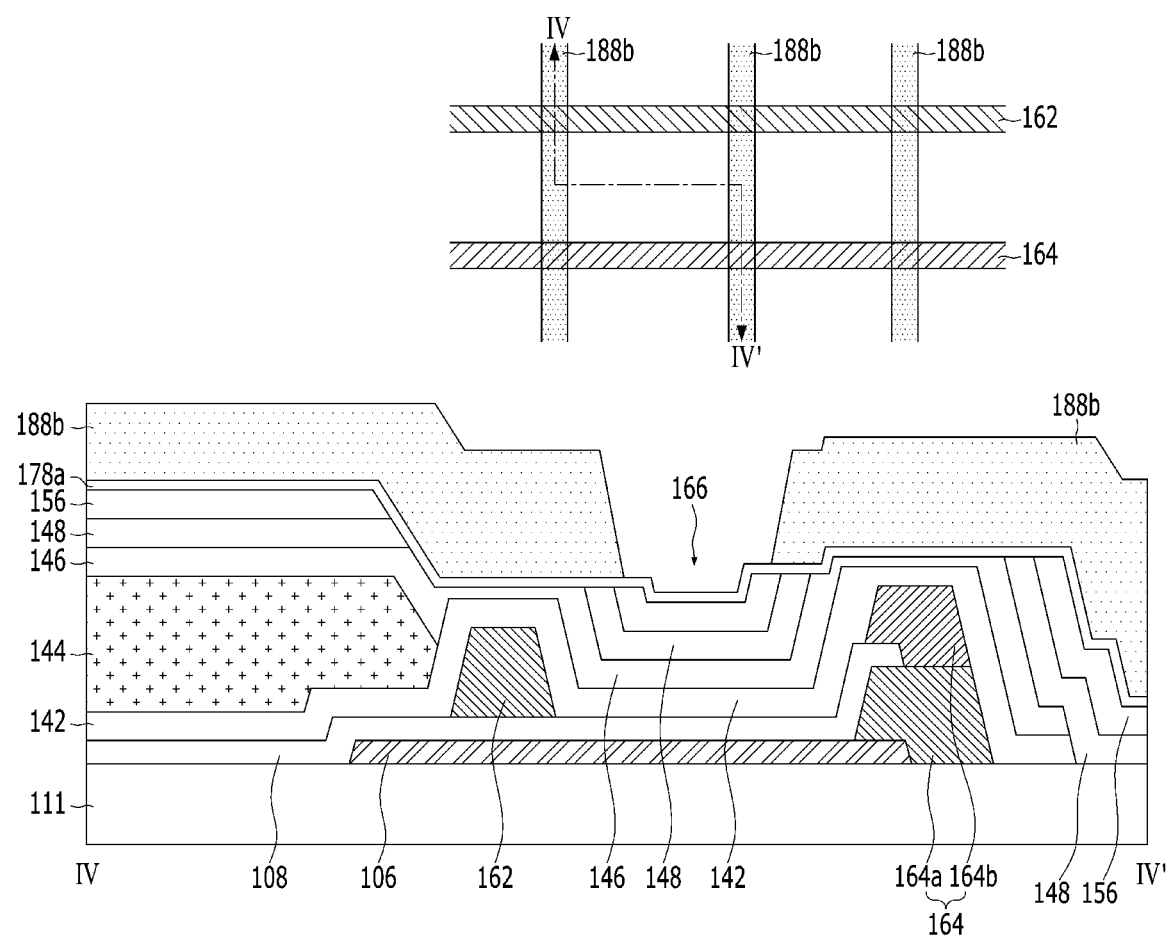

FIGS. 5A to 5C are cross-sectional views illustrating a method of manufacturing a routing line according to a comparative example, and FIGS. 6A to 6C are cross-sectional views illustrating a method of manufacturing the routing line according to an embodiment of the present disclosure. The comparative example has a structure in which the total thickness of inorganic insulation layers disposed above the dams 162 and 164 is the same as the total thickness of the inorganic insulation layers disposed in the trench region 166 between the dams 162 and 164. The embodiment has a structure in which the total thickness of inorganic insulation layers disposed above the dams 162 and 164 is less than the total thickness of the inorganic insulation layers disposed in the trench region 166 between the dams 162 and 164.

In the comparative example, as illustrated in FIG. 5A, a conductive layer 178a is deposited on the entire surface of the touch insulation film 156 so as to cover the first and second dams 162 and 164, and a photoresist 188a is coated on the conductive layer 178a. Here, since the photoresist 188a is an organic insulation material in a liquid state, the thickness d1 of the photoresist 188a coated on the trench region 166 between the first and second dams 162 and 164 is greater than the thickness d2 of the photoresist 188a coated on the region above each of the first and second dams 162 and 164. If an exposure is determined on the basis of the thickness of the photoresist 188a formed on the region above each of the first and second dams 162 and 164, the photoresist 188a formed with a relatively large thickness on the trench region 166 between the first and second dams 162 and 164 is not normally exposed. Thus, as illustrated in FIG. 5B, a residual film 188c of the photoresist is left behind after the developing process. If the conductive layer 178a is etched using a photoresist pattern 188b having the residual film 188c, as illustrated in FIG. 5C, the conductive layer 178a remains in the region corresponding to the residual film 188c of the photoresist, and thus short-circuit occurs between adjacent routing lines 160. On the other hand, if an exposure is increased in order to prevent the residual film 188c of the photoresist from being left behind in the trench region 166 between the first and second dams 162 and 164, productivity is deteriorated.

In the embodiment, as illustrated in FIG. 6A, a conductive layer 178a is deposited on the entire surfaces of the touch insulation film 156 disposed in the trench region 166 between the first and second dams 162 and 164 and the second inorganic encapsulation layer 146 disposed in the region above each of the first and second dams 162 and 164, and a photoresist 188a is coated on the conductive layer 178a. Here, the thickness of the photoresist 188a formed in the region above each of the first and second dams 162 and 164 and the thickness of the photoresist 188a formed in the trench region between the first and second dams 162 and 164 are the same as each other. After the process of exposing and developing the photoresist 188a, as illustrated in FIG. 6B, a photoresist pattern 188b having a uniform thickness is formed in the region above each of the first and second dams 162 and 164 and in the trench region 166 between the first and second dams 162 and 164. Here, since the thickness of the photoresist pattern 188b formed in the trench region 166 between the first and second dams 162 and 164 illustrated in FIG. 6B is less than the thickness of the photoresist pattern 188b formed in the trench region 166 between the first and second dams 162 and 164 illustrated in FIG. 5B, it is possible to reduce exposure compared to the comparative example, and thus the embodiment may shorten the exposure time and consequently may improve productivity.

The conductive layer 178a is patterned through the etching process using the photoresist pattern 188b as a mask, and the routing lines 160 having desired design widths are formed, as illustrated in FIG. 6C. Thus, the embodiment of the present disclosure may prevent short-circuit between adjacent routing lines 160.

As described above, in the organic light-emitting display device having a touch sensor according to the present disclosure, the thickness of the thin-film layer disposed on the region above each of the first and second dams 162 and 164 is less than the thickness of the thin-film layer disposed on the trench region 166 between the first and second dams 162 and 164. In this case, a photoresist for forming the routing line is formed so as to have a uniform thickness on the trench region 166 between the first and second dams 162 and 164 and the region above each of the first and second dams 162 and 164. Thus, even when an exposure of the photoresist for forming the routing line 160, which is formed in the trench region 166 between the first and second dams 162 and 164, is reduced compared to the comparative example, it is possible to prevent the generation of a residual film of the photoresist for forming the routing line. As a result, it is possible to prevent the occurrence of short-circuit in the routing line 160 in the trench region 166 between the first and second dams 162 and 164 and to improve productivity.

Figure 7:
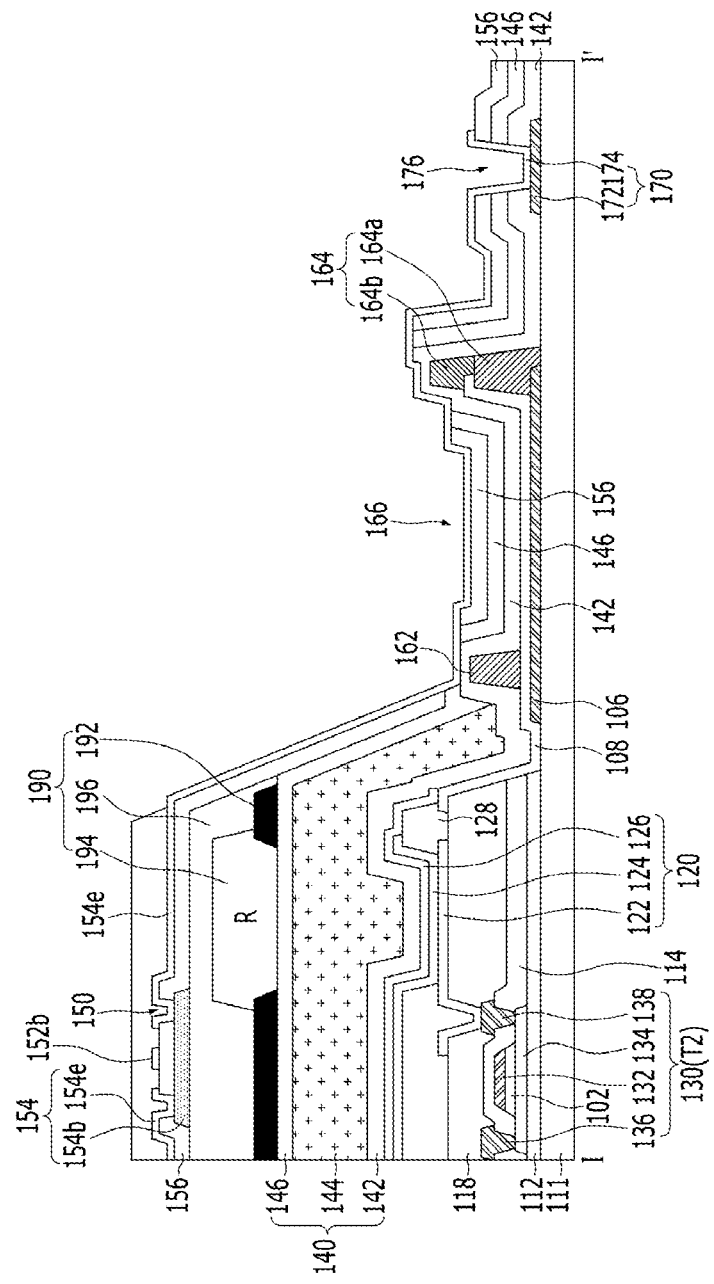
FIG. 7 is a cross-sectional view illustrating an organic light-emitting display device having a touch sensor according to a third embodiment of the present disclosure.

FIG. 7 is a cross-sectional view illustrating an organic light-emitting display device having a touch sensor according to a third embodiment of the present disclosure.

The organic light-emitting display device illustrated in FIG. 7 has the same constituent components as the organic light-emitting display devices illustrated in FIGS. 3 and 4, except that color filters 194 are further provided. A detailed explanation of the same constituent components will be omitted for the sake of brevity.

The color filters 194 are formed between each of the touch-sensing line 154 and the touch-driving line 152 and the light-emitting element 120. The spacing distance between each of the touch-sensing line 154 and the touch-driving line 152 and the light-emitting element 120 is increased by the color filters 194. Thus, the capacity of a parasitic capacitor formed between each of the touch-sensing line 154 and the touch-driving line 152 and the light-emitting element 120 may be minimized, and mutual interaction due to coupling between each of the touch-sensing line 154 and the touch-driving line 152 and the light-emitting element 120 may be prevented. In addition, the color filters 194 are capable of preventing liquid chemical (developer, etchant or the like), which is used for the manufacture of the touch-sensing line 154 and the touch-driving line 152, or external moisture from permeating the light-emitting stack 124. Thus, the color filters 194 are capable of preventing damage to the light-emitting stack 124, which is vulnerable to liquid chemical or moisture. As illustrated in FIG. 7, the structure in which the touch electrodes 152e and 154e are disposed on the color filters 194 has been described by way of example, but the color filters 194 may be disposed on the touch electrodes 152e and 154e. In this case, the touch electrodes 152e and 154e may be disposed between the color filters 194 and the encapsulation unit 140.

A black matrix 192 is disposed between the color filters 194. The black matrix 192 serves to divide the subpixel areas from each other and to prevent optical interference and light leakage between the adjacent subpixel areas. The black matrix 192 is formed of a black insulation material having high resistance, or is formed such that at least two of red (R), green (G) and blue (B) color filters 194 are stacked. A touch planarization layer 196 is formed on the substrate 111, on which the color filters 194 and the black matrix 192 have been formed. The substrate 111, on which the color filters 194 and the black matrix 192 have been formed, is flattened by the touch planarization layer 196.

FIGS. 8A to 8D are views illustrating a method of manufacturing the organic light-emitting display device having a touch sensor according to an embodiment of the present disclosure. The manufacturing method will be described with reference to the organic light-emitting display device illustrated in FIG. 4, but is not limited hereto.

Figure 8A:
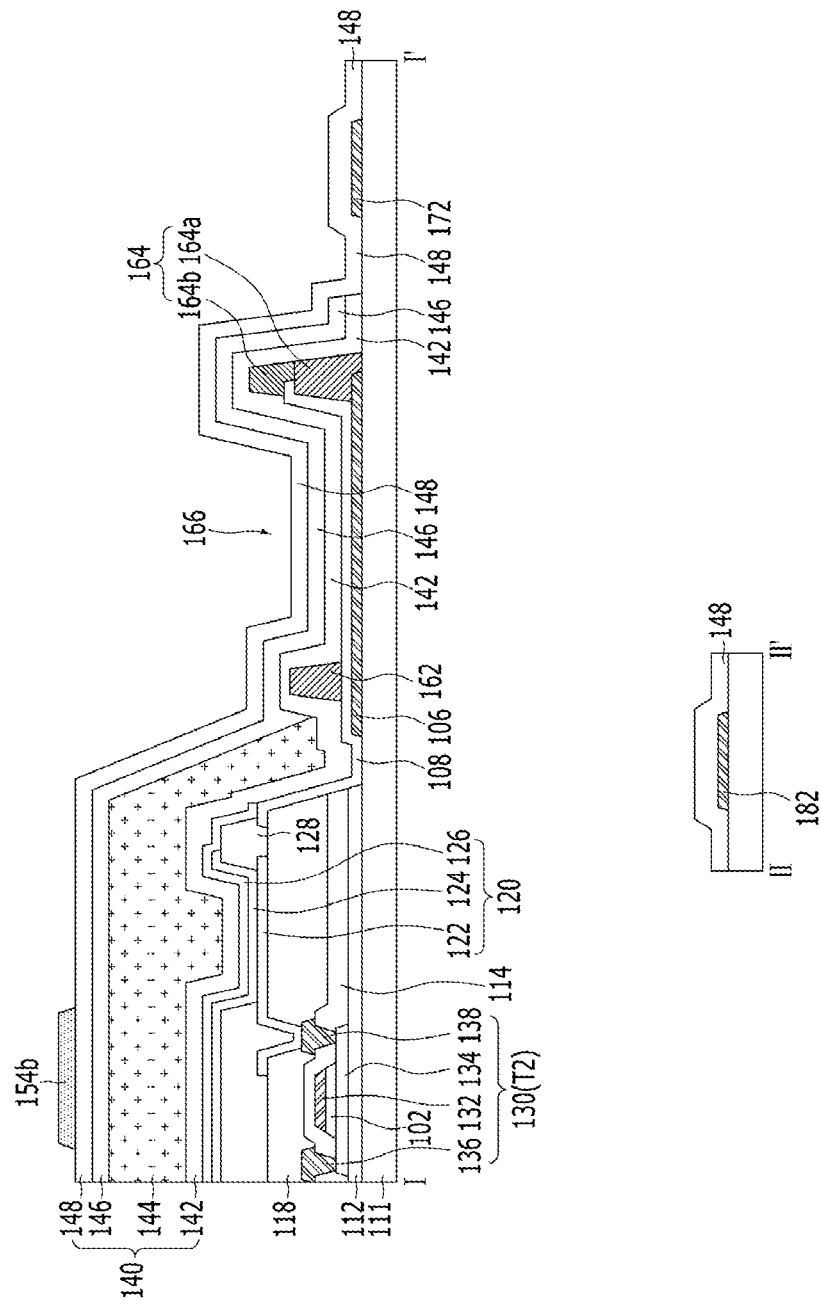
FIGS. 8A to 8D are cross-sectional views illustrating a method of manufacturing the organic light-emitting display device having a touch sensor illustrated in FIG. 4 according to an embodiment of the present disclosure.

Referring to FIG. 8A, the second bridge 154b is formed on the substrate 111, on which the switching transistor, the driving transistor T2 or 130, the lower touch pad electrode 172, the lower display pad electrode 182, the light-emitting element 120, the dams 162 and 164, the encapsulation unit 140 and the touch buffer film 148 have been formed.

Specifically, the substrate 111, on which the switching transistor, the driving transistor T2 or 130, the lower touch pad electrode 172, the lower display pad electrode 182, the light-emitting element 120, the dams 162 and 164, the encapsulation unit 140 and the touch buffer film 148 have been formed, is provided. Here, the touch buffer film 148 is disposed on the lower touch pad electrode 172 and the lower display pad electrode 182 so as to cover the lower touch pad electrode 172 and the lower display pad electrode 182. Subsequently, a first conductive layer, which is formed of the same material as the lower touch pad electrode 172 and the lower display pad electrode 182, is deposited on the substrate 111, on which the touch buffer film 148 is formed. The first conductive layer is formed of a metal material, such as Ti, Cu, Mo, Ta, or MoTi, and is formed in a single-layer or multi-layer structure. For example, the first conductive layer is formed in a triple-layer structure such as a stack of Ti/Al/Ti, MoTi/Cu/MoTi, or Ti/Al/Mo. Subsequently, the first conductive layer is patterned through a photolithography process and an etching process using a photomask, thereby forming the second bridge 154b on the touch buffer film 148. During the formation of the second bridge 154b, the lower touch pad electrode 172 and the lower display pad electrode 182 are protected by the buffer film 148, thereby preventing damage to the lower touch pad electrode 172 and the lower display pad electrode 182.

Figure 8B:
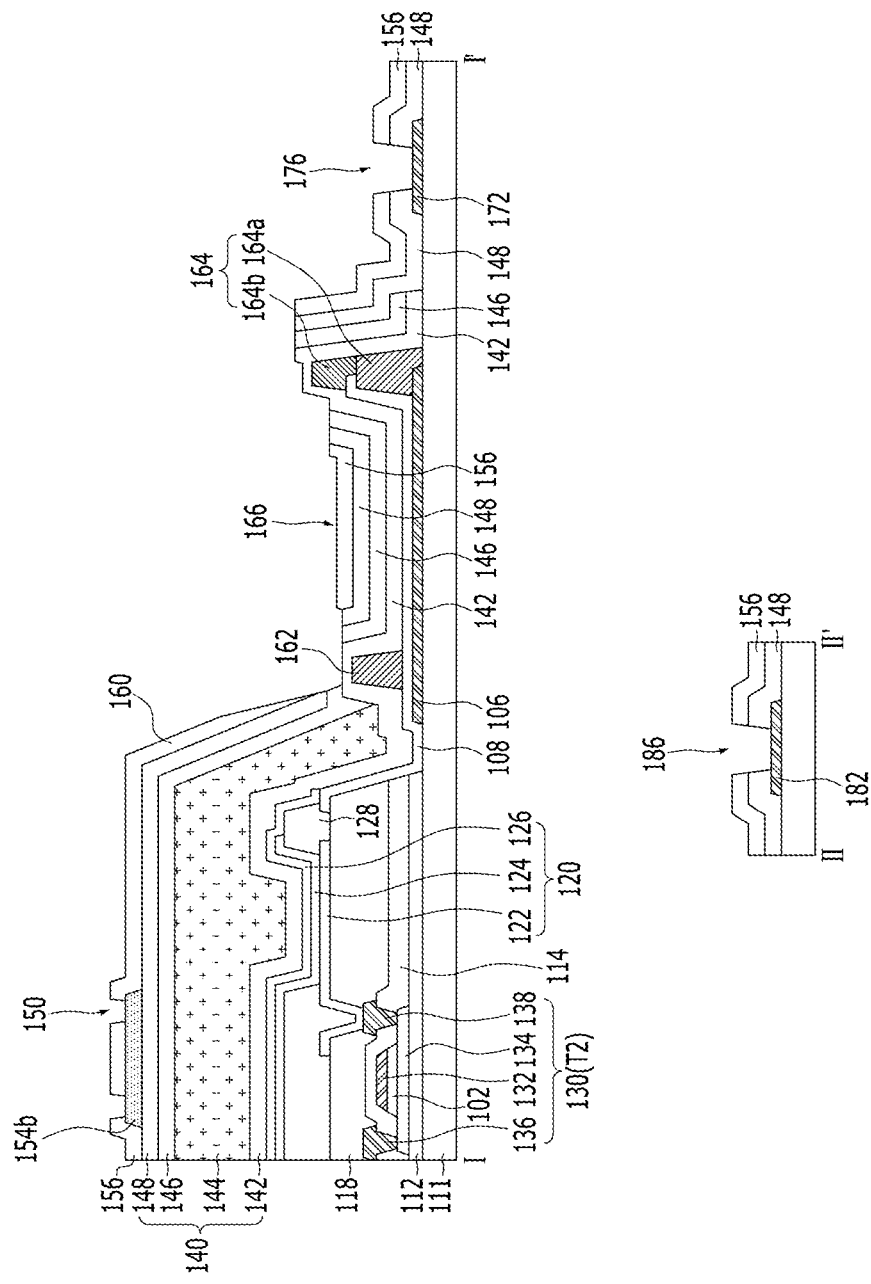

Referring to FIG. 8B, the touch insulation film 156, which has therein the touch contact hole 150, the touch pad contact hole 176 and the display pad contact hole 186, is formed on the substrate 111, on which the second bridge 154b has been formed.

Specifically, the touch insulation film 156 is formed by coating an inorganic insulation material or an organic insulation material on the entire surface of the substrate 111, on which the second bridge 154b has been formed. Here, the touch insulation film 156 is formed of an inorganic insulation material such as SiNx, SiON, or SiO$_2$, photoacryl, parylene, or a siloxane-based organic insulation material. Subsequently, the touch insulation film 156 and the touch buffer film 148 are selectively etched using the photoresist pattern, which has been formed through the photolithography process using the photomask, as a mask. Thus, the touch contact hole 150, the touch pad contact hole 176, and the display pad contact hole 186 are formed, and the touch insulation film 156 and the touch buffer film 148, which are disposed on the first and second dams 162 and 164, are removed. At this time, the second inorganic encapsulation layer 146 disposed on the first and second dams 162 and 164 may be removed, or a portion of the first inorganic encapsulation layer 142 and the second inorganic encapsulation layer 146 may be removed.

Figure 8C:
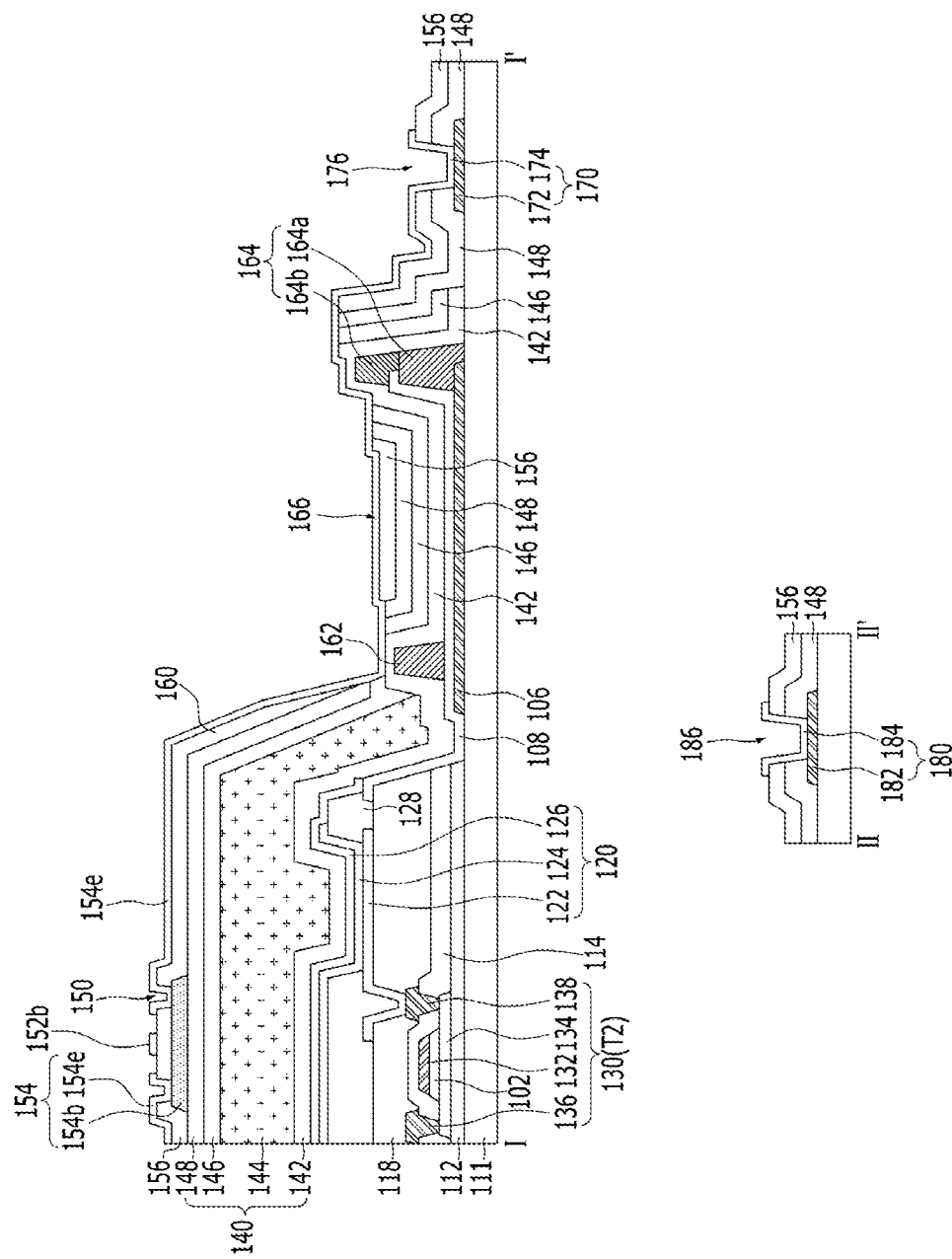

Referring to FIG. 8C, the first and second touch electrodes 152e and 154e, the first bridge 152b, the routing line 160, the upper touch pad electrode 174, and the upper display pad electrode 184 are formed on the substrate 111, on which the touch insulation film 156, which has therein the touch contact hole 150, the touch pad contact hole 176 and the display pad contact hole 186, has been formed.

Specifically, a second conductive layer is deposited on the substrate 111, on which the touch contact hole 150, the touch pad contact hole 176 and the display pad contact hole 186 have been formed. Here, the second conductive layer may be formed of at least one of a transparent conductive layer and an opaque conductive layer. The transparent conductive layer is formed of IGZO, IZO, ITO, or ZnO, and the opaque conductive layer is formed of a metal material, such as Al, Ti, Cu, Mo, Ta, or MoTi, and is formed in a single-layer or multi-layer structure. For example, the second conductive layer is formed in a triple-layer structure such as a stack of Ti/Al/Ti, MoTi/Cu/MoTi, or Ti/Al/Mo. Subsequently, the second conductive layer is patterned through a photolithography process and an etching process, thereby forming the first and second touch electrodes 152e and 154e, the first bridge 152b, the routing line 160, the upper touch pad electrode 174, and the upper display pad electrode 184.

Figure 8D:
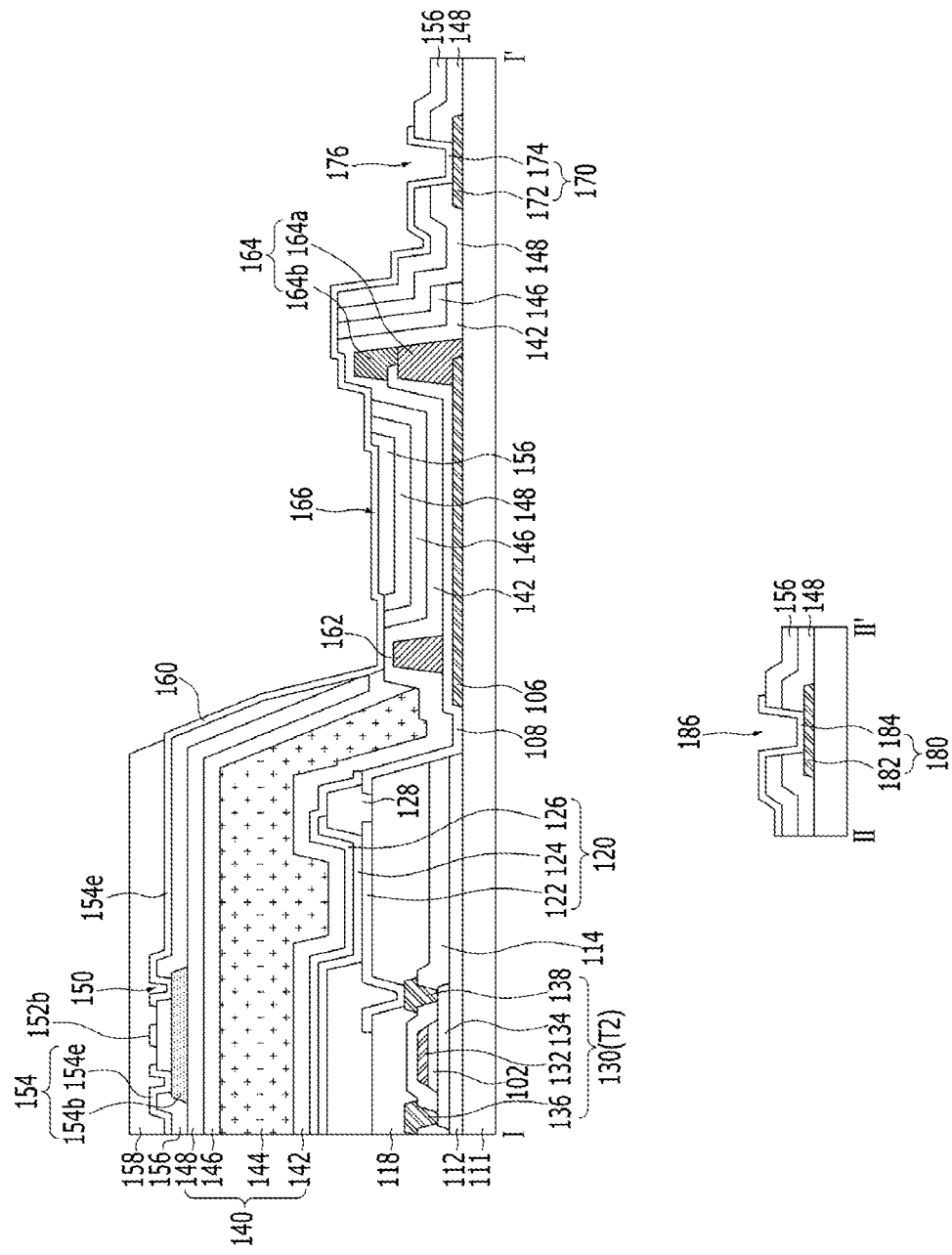

Referring to FIG. 8D, the touch protective film 158 is formed on the substrate 111, on which the first and second touch electrodes 152e and 154e, the first bridge 152b, the routing line 160, the upper touch pad electrode 174 and the upper display pad electrode 184 have been formed.

Specifically, an inorganic insulation material or an organic insulation material is formed on the entire surface of the substrate 111, on which the first and second touch electrodes 152e and 154e, the first bridge 152b, the first touch routing line 162, the touch pad 170 and the display pad 180 have been formed. Subsequently, the inorganic insulation material or the organic insulation material is patterned through a photolithography process and an etching process, thereby forming the touch protective film 158. The touch protective film 158 is formed in a film or thin-film configuration using an organic insulation material such as epoxy or acrylic, or is formed of an inorganic insulation material such as SiNx or SiOx.

As described above, in the organic light-emitting display device having a touch sensor according to the present disclosure, the thickness of the thin-film layer disposed on the region above each of the first and second dams 162 and 164 is less than the thickness of the thin-film layer disposed on the trench region 166 between the first and second dams 162 and 164. Thus, it is possible to prevent the generation of a residual film of the photoresist for forming the routing line in the trench region 166 between the first and second dams 162 and 164 and to prevent the occurrence of short-circuit in the routing line 160 in the trench region 166 between the first and second dams 162 and 164.

Figure 9A:
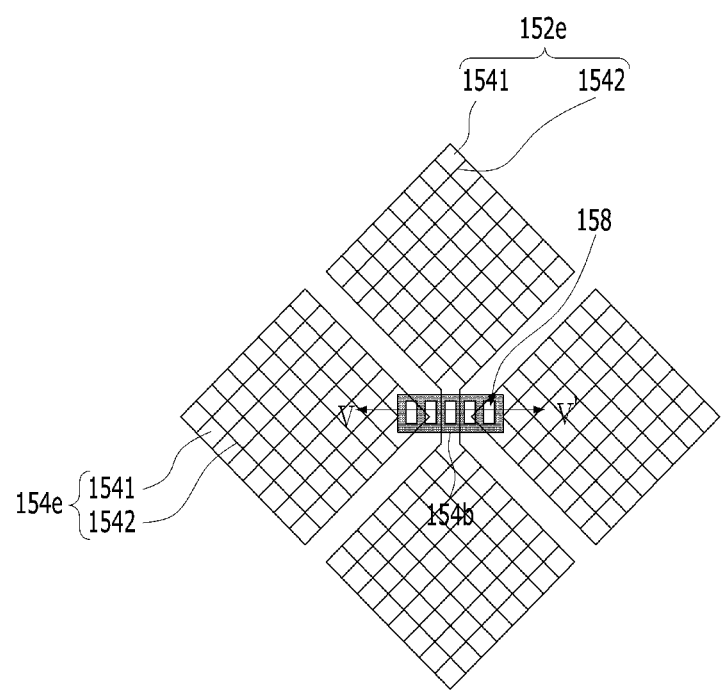
FIGS. 9A and 9B are a plan view and a cross-sectional view, respectively, illustrating another example of the first and second touch electrodes and the second bridge illustrated in FIG. 4 according to an embodiment of the present disclosure.
Figure 9B:
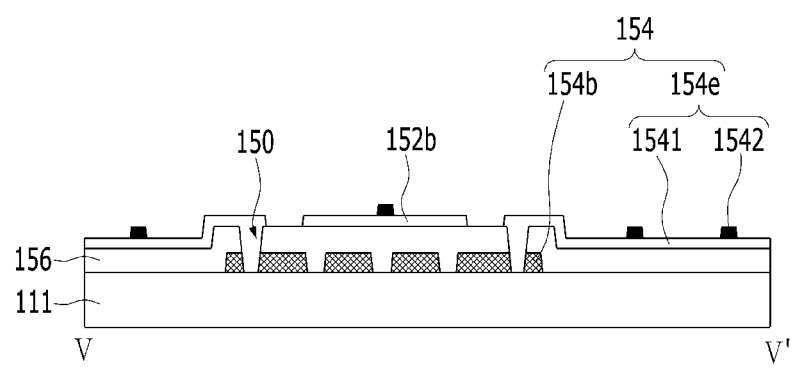

Meanwhile, in the present disclosure, the configuration in which the first and second touch electrodes 152e and 154e and the first and second bridges 152b and 154b are formed to have a plate shape, as illustrated in FIG. 4, has been described by way of example, the first and second touch electrodes 152e and 154e and the first and second bridges 152b and 154b may be formed to have a mesh shape, as illustrated in FIGS. 9A and 9B. That is, at least one of the first touch electrode 152e and the second touch electrode 154e and at least one of the first bridge 152b and the second bridge 154b may be formed of a transparent conductive film 1541, such as ITO or IZO, and a mesh metal film 1542 disposed above or under the transparent conductive film 1541 and having a mesh shape. Alternatively, at least one of the first touch electrode 152e and the second touch electrode 154e and the first and second bridges 152b and 154b may be formed of only the mesh metal film 1542 without the transparent conductive film 1541, or may be formed of the transparent conductive film 1541 having a mesh shape without the mesh metal film 1542. Here, the mesh metal film 1542 is formed to have a mesh shape using a conductive layer of at least one of Ti, Al, Mo, MoTi, Cu, Ta, or ITO, so as to have higher conductivity than the transparent conductive film 1541. For example, the mesh metal film 1542 is formed in a triple-layer structure such as a stack of Ti/Al/Ti, MoTi/Cu/MoTi, or Ti/Al/Mo. Thereby, the resistance and the capacitance of the first and second touch electrodes 152*e* and 154*e* and the first bridge 152*b* may be reduced, and the RC time constant may be reduced, which may result in increased touch sensitivity. In addition, since the mesh metal film 1542 of each of the first and second touch electrodes 152*e* and 154*e* and the first bridge 152*b* has a very small line width, it is possible to prevent deterioration in the aperture ratio and transmissivity due to the mesh metal film 1542.

Moreover, in the present disclosure, the mutual-capacitance-type touch sensor, which includes the touch-sensing line 154 and the touch-driving line 152 intersecting each other with the touch insulation film 156 interposed therebetween, has been described by way of example, but the present disclosure may also be applied to a self-capacitance-type touch sensor. Each of a plurality of self-capacitance-type touch electrodes has an electrically independent self-capacitance, and thus is used as a self-capacity-type touch sensor that senses variation in capacitance by a user touch. That is, the routing lines 160 connected to the self-capacitance-type touch electrodes are disposed on the region above each of the first and second dams 162 and 164 and the trench region 166 between the first and second dams 162 and 164, which have a reduced unevenness therebetween. As a result, short-circuit in the routing lines 160 is prevented, and thus reliability is increased.

As is apparent from the above description, a display device having a touch sensor according to the present disclosure is configured such that the total thickness of inorganic insulation layers disposed on the region above each of dams is less than the total thickness of the inorganic insulation layers disposed on a trench region between the dams. Thus, since the unevenness between the region above each of dams and the trench region between the dams is reduced, and thus the thickness of a photoresist for forming a routing line in the trench region between the dams is reduced. As a result, it is possible to reduce an exposure of the photoresist for forming a routing line and consequently to improve productivity.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A display device comprising:
a light-emitting element disposed in an active area of a substrate;
a touch sensor disposed on the light-emitting element;
an encapsulation unit disposed between the light-emitting element and the touch sensor, the encapsulation unit comprising a plurality of inorganic encapsulation layers and at least one organic encapsulation layer disposed between the inorganic encapsulation layers,
a plurality of color filters disposed on the touch sensor and the light-emitting element,
a touch pad disposed in a pad area of the substrate, the touch pad being electrically connected to the touch sensor; and
a first dam and a second dam disposed between the active area and the pad area,
wherein a total thickness of at least one inorganic insulation layer disposed on at least one of the first dam and the second dam is different from a total thickness of the at least one inorganic insulation layer disposed in a trench region between the first dam and the second dam.

2. The display device according to claim 1, wherein the total thickness of the at least one inorganic insulation layer disposed on the at least one of the first dam and the second dam is less than the total thickness of the at least one inorganic insulation layer disposed in the trench region.

3. The display device according to claim 1, further comprising a routing line electrically connecting the touch sensor and the touch pad, wherein the routing line is disposed on the encapsulation unit.

4. The display device according to claim 3, wherein a total thickness of the at least one inorganic insulation layer disposed between the at least one of the first dam and the second dam and a lower surface of the routing line is less than a total thickness of the at least one inorganic insulation layer disposed between an upper surface of a conductive layer disposed below the second dam and the lower surface of the routing line.

5. The display device according to claim 4, wherein the conductive layer is electrically connected to a cathode of the light-emitting element.

6. The display device according to claim 4, wherein the touch sensor comprises a touch insulating film disposed on the encapsulation unit, and
wherein the touch insulating film is disposed in the trench region.

7. The display device according to claim 6, wherein the touch sensor further comprises a touch-sensing line and a touch-driving line disposed with the touch insulation film interposed therebetween, and
wherein the at least one inorganic insulation layer comprises at least one of the plurality of inorganic encapsulation layers and the touch insulation film.

8. The display device according to claim 7, wherein the at least one of the plurality of inorganic encapsulation layers is disposed between the first dam and the second dam and the lower surface of the routing line, and
wherein the at least one of the inorganic encapsulation layers and the touch insulation film are disposed between the upper surface of a conductive layer and the lower surface of the routing line.

9. The display device according to claim 7, further comprising:
a touch buffer film disposed between the touch insulation film and the encapsulation unit,
wherein the at least one inorganic insulation layer comprises the at least one of the inorganic encapsulation layers, the touch buffer film, and the touch insulation film.

10. The display device according to claim 9, wherein the touch pad comprises:
a lower touch pad electrode disposed on the substrate; and
an upper touch pad electrode connected to the lower touch pad electrode exposed through a touch contact hole penetrating the touch buffer film and the touch insulation film.

11. The display device according to claim 1, further comprising:
a thin-film transistor disposed in the active area and electrically connected to the light-emitting element.

12. The display device according to claim 11, further comprising:
a low-voltage supply line disposed on the substrate and below the first dam and the second dam.

13. The display device according to claim 12, further comprising:
an auxiliary electrode disposed between the low-voltage supply line and a cathode of the light-emitting element, and electrically connecting the low-voltage supply line and the cathode to each other.

14. The display device according to claim 13, wherein the second dam includes a first sub-dam and a second sub-dam, and the auxiliary electrode is partially disposed between the first sub-dam and the second sub-dam.

15. The display device according to claim 14, wherein the auxiliary electrode is at least partially disposed on a side surface of the first sub-dam of the second dam.

16. The display device according to claim 12, wherein the second dam covers a side surface of the low-voltage supply line.

17. The display device according to claim 12, wherein the low-voltage supply line is formed of a same material as a source electrode and a drain electrode of the thin-film transistor.

18. The display device according to claim 1, further comprising:
a plurality of black matrices between the plurality of color filters.

* * * * *